United States Patent
Okabe et al.

(10) Patent No.: US 10,438,731 B2
(45) Date of Patent: Oct. 8, 2019

(54) INDUCTOR AND POWER AMPLIFIER MODULE

(71) Applicant: Murata Manufacturing Co., Ltd., Kyoto (JP)

(72) Inventors: Takeyuki Okabe, Kyoto (JP); Eigo Tange, Kyoto (JP); Takayuki Tsutsui, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/026,469

(22) Filed: Jul. 3, 2018

(65) Prior Publication Data
US 2019/0006075 A1   Jan. 3, 2019

(30) Foreign Application Priority Data
Jul. 3, 2017 (JP) .................................. 2017-130387

(51) Int. Cl.
| | |
|---|---|
| *H03F 3/187* | (2006.01) |
| *H01F 17/00* | (2006.01) |
| *H03F 3/19* | (2006.01) |
| *H03F 3/21* | (2006.01) |
| *H03F 3/60* | (2006.01) |

(52) U.S. Cl.
CPC .......... *H01F 17/0013* (2013.01); *H03F 3/19* (2013.01); *H03F 3/21* (2013.01); *H03F 3/60* (2013.01); *H01F 2017/002* (2013.01); *H01F 2017/004* (2013.01); *H01F 2017/0073* (2013.01); *H03F 2200/301* (2013.01); *H03F 2200/387* (2013.01); *H03F 2200/451* (2013.01)

(58) Field of Classification Search
CPC ....................................................... H03F 3/187
USPC .................................................. 330/197, 165
See application file for complete search history.

(56) References Cited

U.S. PATENT DOCUMENTS

| | | | |
|---|---|---|---|
| 7,579,930 B2* | 8/2009 | Hosokawa | ............. H04B 1/005 333/126 |
| 7,960,212 B2* | 6/2011 | Lee | ....................... H01L 21/563 438/106 |
| 2005/0140434 A1 | 6/2005 | Abe et al. | |

(Continued)

FOREIGN PATENT DOCUMENTS

| | | |
|---|---|---|
| JP | 2001-267512 A | 9/2001 |
| JP | 2005-210044 A | 8/2005 |
| JP | 2006-173145 A | 6/2006 |

*Primary Examiner* — Henry Choe
(74) *Attorney, Agent, or Firm* — Pearne & Gordon LLP

(57) ABSTRACT

An inductor includes first and second wirings respectively formed in a substantially spiral shape on first and second surfaces of a multilayer substrate. The multilayer substrate includes plural dielectric layers stacked on each other in a predetermined direction. The multilayer substrate includes a first layer having the first surface, which is an end surface in the predetermined direction, and a second layer having the second surface within the multilayer substrate. The width of the second wiring is smaller than that of the first wiring. The first and second wirings are electrically connected in parallel with each other. The inductance of the first wiring and that of the second wiring are substantially equal to each other. When the first and second wirings are projected on the first surface in the predetermined direction, entirety of a projected image of the second wiring is contained within that of the first wiring.

16 Claims, 16 Drawing Sheets

(56) References Cited

U.S. PATENT DOCUMENTS

2006/0125589 A1 6/2006 Tamata et al.
2009/0146760 A1* 6/2009 Reefman ............ H01L 23/3107
  333/184

* cited by examiner

INDUCTOR AND POWER AMPLIFIER MODULE

This application claims priority from Japanese Patent Application No. 2017-130387 filed on Jul. 3, 2017. The content of this application is incorporated herein by reference in its entirety.

BACKGROUND

The present disclosure relates to an inductor and a power amplifier module. Many mobile terminals include a power amplifier module having a power amplifier and an inductor. The power amplifier amplifies power of a transmit signal. The inductor is provided in a path in which a power supply voltage is supplied to the power amplifier. The inductor serves to efficiently transfer the power supply voltage from a power supply source to the power amplifier and also to reduce a leakage of output of the power amplifier into the power supply source. To achieve these functions, the resistance of the inductor may be low and the inductance thereof may be high. Japanese Unexamined Patent Application Publication No. 2005-210044 discloses a power amplifier module including a multilayer substrate constituted by plural conductive layers. Conductors having an inductor function are disposed on one or more conductive layers of the multilayer substrate. The thickness of at least some of the conductors having the inductor function are made thicker than that of conductors formed on insulating bases within the multilayer substrate other than the conductors having the inductor function.

BRIEF SUMMARY

However, the power amplifier module disclosed in the above-described publication may fail to achieve a sufficient level of inductance of the inductors although it can reduce the loss of the conductors having the inductor function.

The present disclosure has been made in view of this background. The present disclosure provides an inductor which exhibits a sufficient level of inductance while reducing the resistance value and also providing a power amplifier module including such an inductor.

According to an embodiment of the present disclosure, there is provided an inductor including first and second wirings. The first wiring is formed in a substantially spiral shape on a first surface of a multilayer substrate. The second wiring is formed in a substantially spiral shape on a second surface of the multilayer substrate. The multilayer substrate is constituted by a plurality of dielectric layers stacked on each other in a predetermined direction. The multilayer substrate includes a first layer and a second layer. The first layer has the first surface, which is an end surface in the predetermined direction. The second layer has the second surface within the multilayer substrate. A width of the second wiring is smaller than a width of the first wiring. The first and second wirings are electrically connected in parallel with each other. When the first and second wirings are projected on the first surface in the predetermined direction, entirety of a projected image of the second wiring is contained within a projected image of the first wiring.

According to an embodiment of the present disclosure, there is provided a power amplifier module including a power amplifier and an inductor. The power amplifier amplifies an input signal and outputs an amplified input signal. The inductor is connected at one end to a power supply source and at the other end to an output terminal of the power amplifier. The inductor includes first and second wirings. The first wiring is formed in a substantially spiral shape on a first surface of a multilayer substrate. The second wiring is formed in a substantially spiral shape on a second surface of the multilayer substrate. The multilayer substrate is constituted by a plurality of dielectric layers stacked on each other in a predetermined direction. The multilayer substrate includes a first layer and a second layer. The first layer has the first surface, which is an end surface in the predetermined direction. The second layer has the second surface within the multilayer substrate. A width of the second wiring is smaller than a width of the first wiring. The first and second wirings are electrically connected in parallel with each other. When the first and second wirings are projected on the first surface in the predetermined direction, entirety of a projected image of the second wiring is contained within a projected image of the first wiring.

According to embodiments of the disclosure, it is possible to provide an inductor which is reduced in size and which exhibits a sufficient level of inductance while reducing the intensity of magnetic fields and the resistance and also to provide a power amplifier module including such an inductor.

Other features, elements, characteristics and advantages of the present disclosure will become more apparent from the following detailed description of embodiments of the present disclosure with reference to the attached drawings.

DETAILED DESCRIPTION

Figure 1:
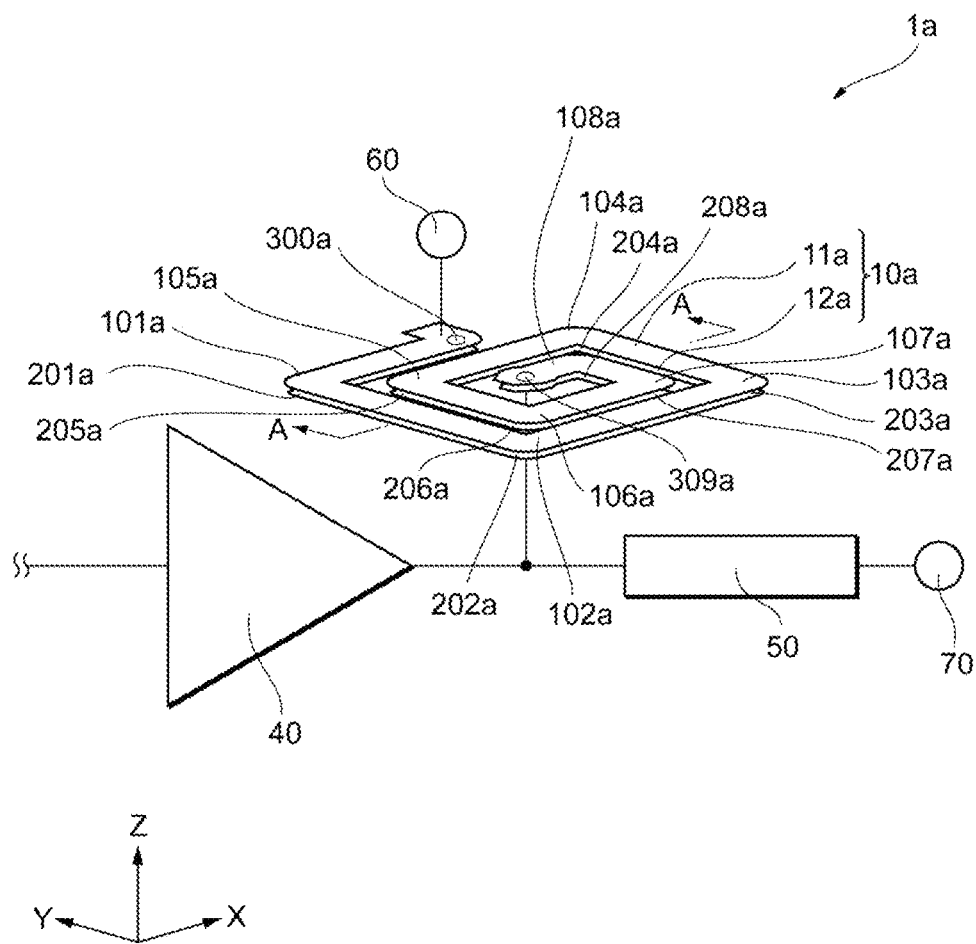
FIG. 1 illustrates a power amplifier, an inductor, and a matching circuit included in a power amplifier module according to an embodiment.

Embodiments of the disclosure will be described below with reference to the accompanying drawings. In the drawings, the same elements or similar elements are designated by like reference numerals.

Figure 2:
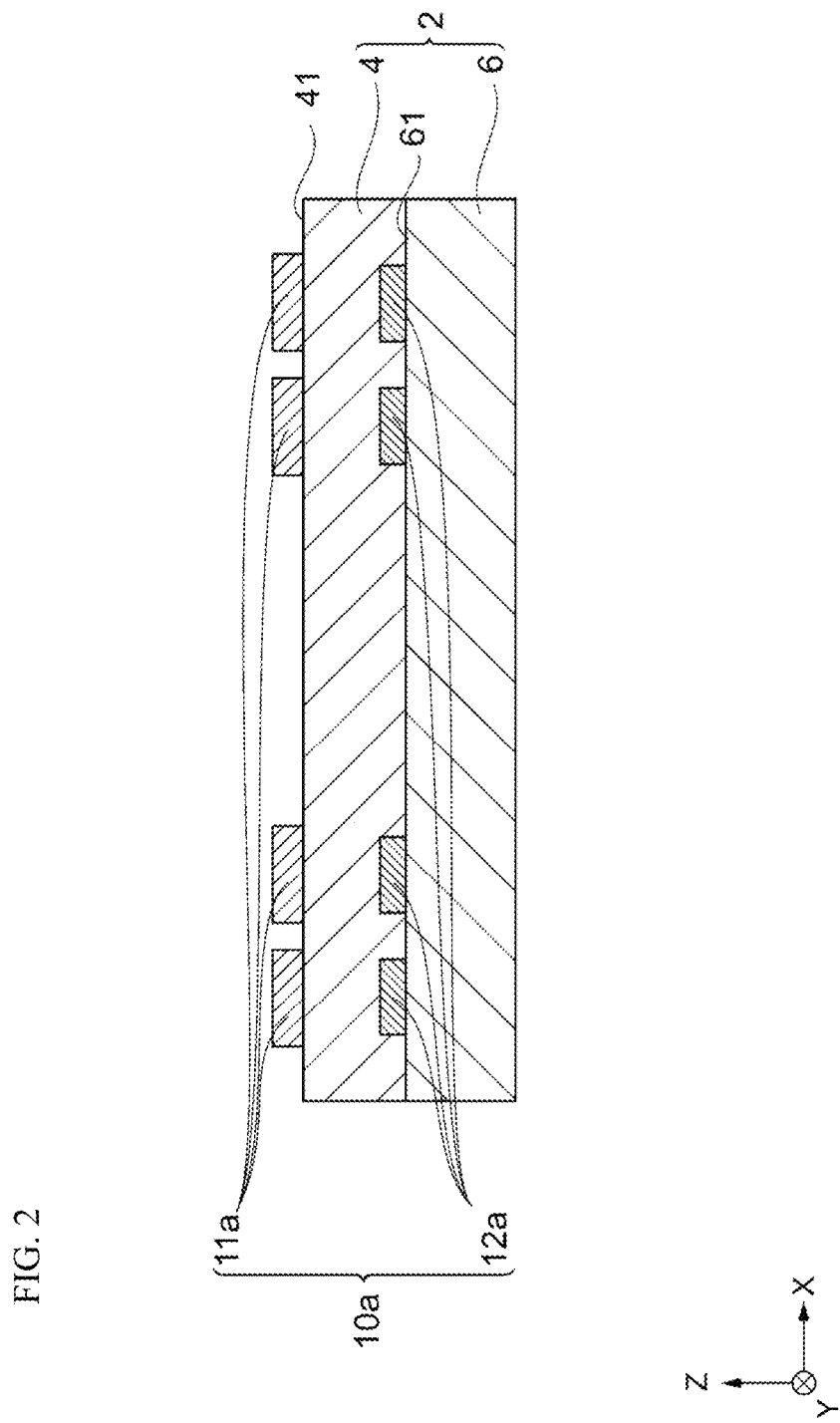
FIG. 2 illustrates the inductor, a multilayer substrate, and a third layer according to this embodiment.
Figure 3:
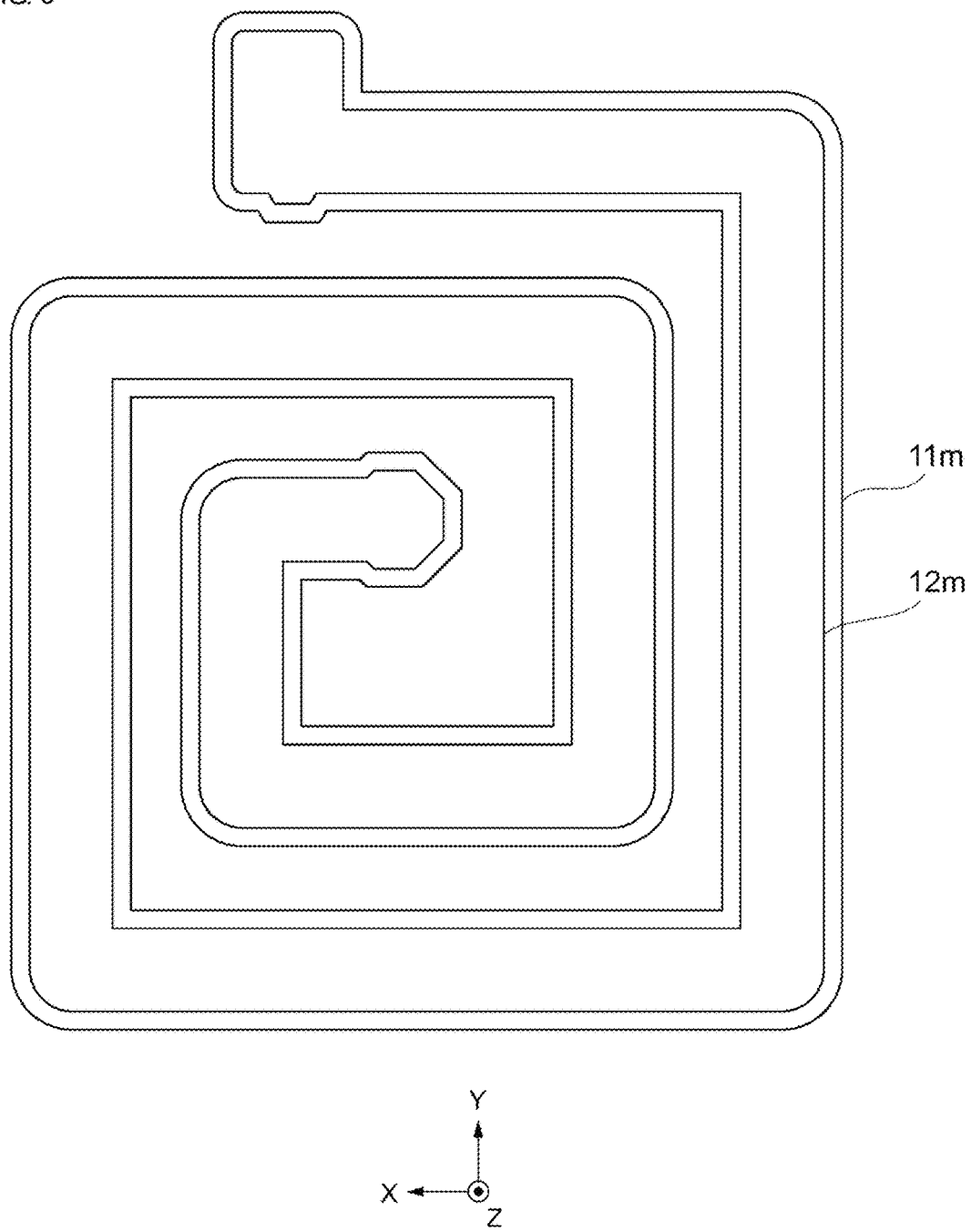
FIG. 3 illustrates projected images obtained by projecting first and second wirings on a first surface in a Z direction.

A power amplifier module 1a according to an embodiment will first be described below with reference to FIGS. 1 through 3. FIG. 1 illustrates a power amplifier, an inductor, and a matching circuit included in the power amplifier module 1a. FIG. 2 is a sectional view taken along line A-A of FIG. 1 and illustrates the inductor, a multilayer substrate, and a third layer. FIG. 3 illustrates projected images obtained by projecting first and second wirings on a first surface in the Z direction.

As shown in FIG. 1, the power amplifier module 1a includes an inductor 10a, a power amplifier 40, and a matching circuit 50. In the following description, the directions of the components will be explained by utilizing X, Y, and Z-axes shown in FIG. 1. As shown in FIGS. 1 through 3, the X, Y, and Z-axes are orthogonal to each other and form three-dimensional orthogonal coordinates.

The inductor 10a is connected at one end to a power supply source 60 and at the other end to an output terminal of the power amplifier 40 and an input terminal of the matching circuit 50. The inductor 10a supplies a direct current (DC) power supply voltage output from the power supply source 60 to the power amplifier 40 and also reduces a leakage of output of the power amplifier 40 into the power supply source 60.

The power amplifier 40 amplifies a radio frequency (RF) input signal, for example, and outputs the amplified signal. The power amplifier 40 is constituted by a bipolar transistor or a metal-oxide-semiconductor field-effect transistor (MOSFET), for example. The matching circuit 50 performs impedance matching between the output impedance of the power amplifier 40 and the input impedance of an output terminal 70. The power supply source 60 supplies a DC power supply voltage to the power amplifier 40. The output terminal 70 outputs an amplified signal received from the power amplifier 40 via the matching circuit 50 to the outside the power amplifier module 1a.

As shown in FIG. 2, the inductor 10a includes a first wiring 11a formed on a multilayer substrate 2 and a second wiring 12a formed in the multilayer substrate 2. The multilayer substrate 2 is constituted by plural dielectric layers stacked in a predetermined direction, that is, in the Z direction. The multilayer substrate 2 includes a first layer 4 and a second layer 6, for example. The first layer 4 has a first surface 41, which is an end surface of the multilayer substrate 2 in a predetermined direction. The second layer 6 has a second surface 61 positioned inside the multilayer substrate 2. The first and second surfaces 41 and 61 are parallel with an XY plane. The first wiring 11a is a flat wiring formed in a substantially spiral shape on the first surface 41. The second wiring 12a is a flat wiring in a substantially spiral shape formed on the second surface 61. The spiral shape is a curve which is closer to or farther away from the center of the spiral as it turns. In this embodiment, the first and second wirings 11a and 12a have plural bending portions.

The width of the second wiring 12a is smaller than that of the first wiring 11a. The first and second wirings 11a and 12a are electrically connected in parallel with each other with the use of via-holes 300a and 309a (see FIG. 1). The inductance of the first wiring 11a and that of the second wiring 12a are substantially equal to each other within the allowance of manufacturing errors. The via-holes 300a and 309a extend in parallel with the Z direction, for example. As shown in FIG. 3, when the first and second wirings 11a and 12a are projected on the first surface 41 in a predetermined direction, that is, in the Z direction, the entirety of a projected image 12m of the second wiring 12a is contained within a projected image 11m of the first wiring 11a.

The first wiring 11a includes first bending portions 101a, 102a, 103a, 104a, 105a, 106a, 107a, and 108a. The outer peripheries of the first bending portions 101a through 108a may be formed by curves and the inner peripheries thereof may bend substantially perpendicularly within the allowance of manufacturing errors. In this case, the curves are arcs, for example. The first wiring 11a may not necessarily include all the first bending portions 101a through 108a and may include at least one of them.

The second wiring 12a includes second bending portions 201a, 202a, 203a, 204a, 205a, 206a, 207a, and 208a. The outer peripheries of the second bending portions 201a through 208a may be formed by curves and the inner peripheries thereof may bend substantially perpendicularly within the allowance of manufacturing errors. In this case, the curves are arcs, for example. The second wiring 12a may not necessarily include all the second bending portions 201a through 208a and may include at least one of them.

In FIG. 1, one end of the inductor 10a (the end near the via-hole 300a) is connected to the power supply source 60, while the other end thereof (the end near the via-hole 309a) is connected to the output terminal of the power amplifier 40. However, the connecting relationship between these components may be reversed. That is, one end of the inductor 10a (the end near the via-hole 300a) may be connected to the output terminal of the power amplifier 40, while the other end thereof (the end near the via-hole 309a) may be connected to the power supply source 60.

Advantages achieved by the configuration in which the width of the second wiring 12a is smaller than that of the first wiring 11a will be discussed below with reference to FIGS. 4 through 6.

Figure 4:
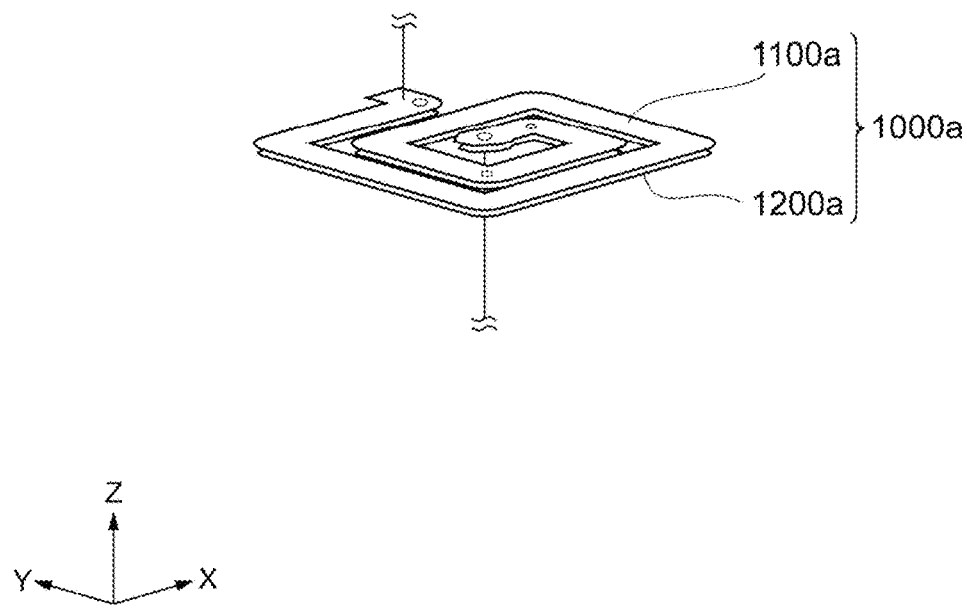
FIG. 4 illustrates an inductor according to a comparative example.

FIG. 4 illustrates an inductor 1000a according to a comparative example. As shown in FIG. 4, the inductor 1000a includes a first wiring 1100a and a second wiring 1200a. The widths of the first and second wirings 1100a and 1200a are equal to the width of the first wiring 11a of the inductor 10a according to the embodiment. The first and second wirings 1100a and 1200a entirely fit each other in the Z direction.

Figure 5:
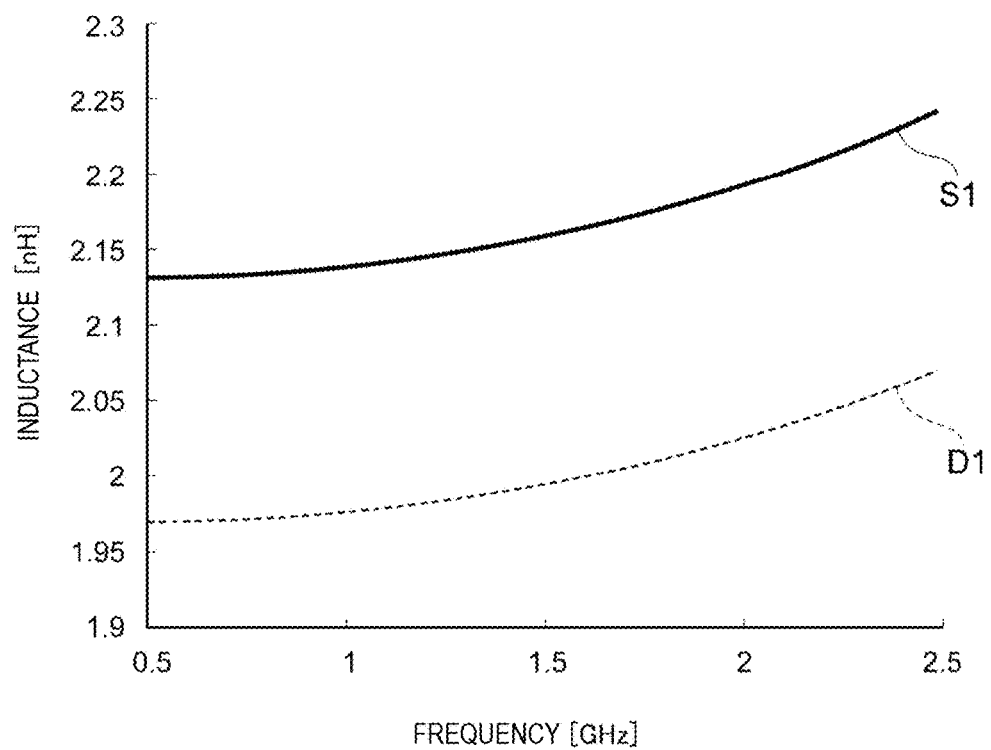
FIG. 5 illustrates the inductance of the inductor according to the embodiment and that of the inductor according to the comparative example.

FIG. 5 illustrates the inductance of the inductor 10a according to the embodiment and that of the inductor 1000a according to the comparative example. In FIG. 5, the horizontal axis indicates the frequency (GHz), while the vertical axis indicates the inductance (nH). The dotted line D1 in FIG. 5 represents the inductance of the inductor 1000a including the first and second wirings 1100a and 1200a, while the solid line S1 in FIG. 5 represents the inductance of the inductor 10a including the first and second wirings 11a and 12a.

FIG. 5 shows that the inductance of the inductor 10a of the embodiment is greater than that of the inductor 1000a of the comparative example. The reason for this is as follows. The inductance of an inductor constituted by plural wirings electrically connected in parallel with each other is maximized when the inductance values of the individual wirings are equal to each other. In this embodiment, the relative dielectric constant of the surface of the first wiring 11a and the front side of the first surface 41 is smaller than that of the first and second layers 4 and 6 in a predetermined direction, and also, the width of the second wiring 12a is smaller than that of the first wiring 11a. Because of these reasons, the impedance of the first wiring 11a and that of the second wiring 12a become substantially equal to each other. The surface of the first wiring 11a may be covered with a dielectric layer having a relative dielectric constant smaller than that of the first and second layers 4 and 6.

Figure 6:
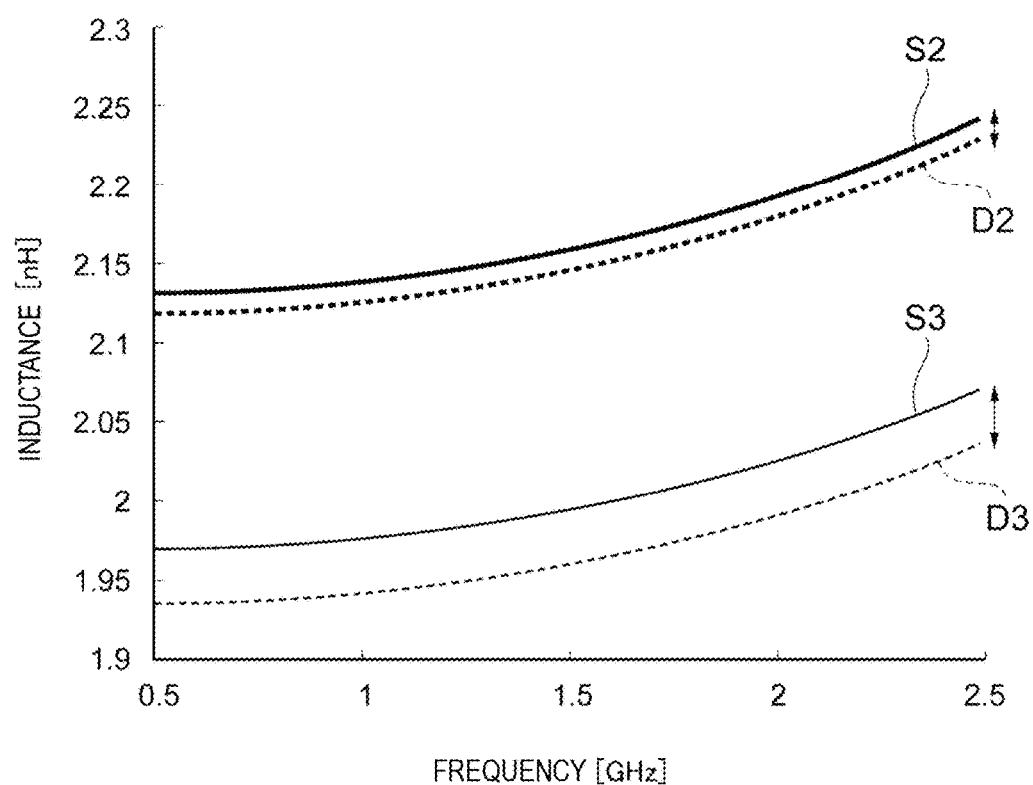
FIG. 6 illustrates the inductance of the inductor according to the embodiment and that of an inductor in which the second wiring of the inductor of the embodiment is displaced by about 40 μm with respect to the first wiring in the +Y direction shown in FIG. 1 and also illustrates the inductance of the inductor according to the comparative example and that of an inductor in which the second wiring of the inductor of the comparative example is displaced by about 40 μm with respect to the first wiring in the +Y direction shown in FIG. 1.

FIG. 6 illustrates the inductance of the inductor 10a according to the embodiment and that of an inductor in which the second wiring 12a of the inductor 10a is displaced by about 40 μm with respect to the first wiring 11a in the +Y direction shown in FIG. 1. FIG. 6 also illustrates the inductance of the inductor 1000a according to the comparative example and that of an inductor in which the second wiring 1200a of the inductor 1000a is displaced by about 40 μm with respect to the first wiring 1100a in the +Y direction shown in FIG. 1.

In FIG. 6, the horizontal axis indicates the frequency (GHz), while the vertical axis indicates the inductance (nH). The solid line S2 in FIG. 6 indicates the inductance of the inductor 10a in which the width of the first wiring 11a is about 0.12 mm and that of the second wiring 12a is about 0.09 mm. The dotted line D2 in FIG. 6 indicates the inductance of the inductor 10a in which the width of the first wiring 11a is about 0.12 mm and that of the second wiring 12a is about 0.09 mm and that the second wiring 12a is displaced by about 40 μm with respect to the first wiring 11a in the +Y direction. The solid line S3 in FIG. 6 indicates the inductance of the inductor 1000a in which the width of the first wiring 1100a is about 0.12 mm and that of the second wiring 1200a is about 0.12 mm. The dotted line D3 in FIG. 6 indicates the inductance of the inductor 1000a in which the width of the first wiring 1100a is about 0.12 mm and that of the second wiring 1200a is about 0.12 mm and that the second wiring 1200a is displaced by about 40 μm with respect to the first wiring 1100a in the +Y direction.

As discussed above, regarding the inductor 10a of the embodiment, the width of the first wiring 11a is about 0.12 mm and that of the second wiring 12a is about 0.09 mm. As indicated by the solid line S2 and the dotted line D2 in FIG. 6, even though the second wiring 12a is displaced by about 40 μm with respect to the first wiring 11a in the +Y direction, the inductance is decreased from that indicated by the solid line S2 only by a relatively small amount over the entire range of the frequency. In contrast, as discussed above, regarding the inductor 1000a, the width of the first wiring 1100a is about 0.12 mm and that of the second wiring 1200a is about 0.12 mm. As indicated by the solid line S3 and the dotted line D3 in FIG. 6, when the second wiring 1200a is displaced by about 40 μm with respect to the first wiring 1100a in the +Y direction, the inductance is decreased from that indicated by the solid line S3 by a relatively large amount over the entire range of the frequency.

The reason for this is as follows. In the inductor 10a of the embodiment, the width of the first wiring 11a is about 0.12 mm and that of the second wiring 12a is about 0.09 mm. In this case, even if the second wiring 12a is somewhat displaced from the first wiring 11a, the entirety of the second wiring 12a is contained within the first wiring 11a in the Z direction. In contrast, in the inductor 1000a of the comparative example, the width of the first wiring 1100a is about 0.12 mm and that of the second wiring 1200a is about 0.12 mm. In this case, if the second wiring 1200a is displaced even slightly from the first wiring 1100a, some portions of the second wiring 1200a is not contained within the first wiring 1100a. The mutual inductance in the upper and lower portions of the substrate is decreased in the portions where the second wiring 1200a is not entirely contained within the first wiring 1100a in the Z direction.

Figure 7:
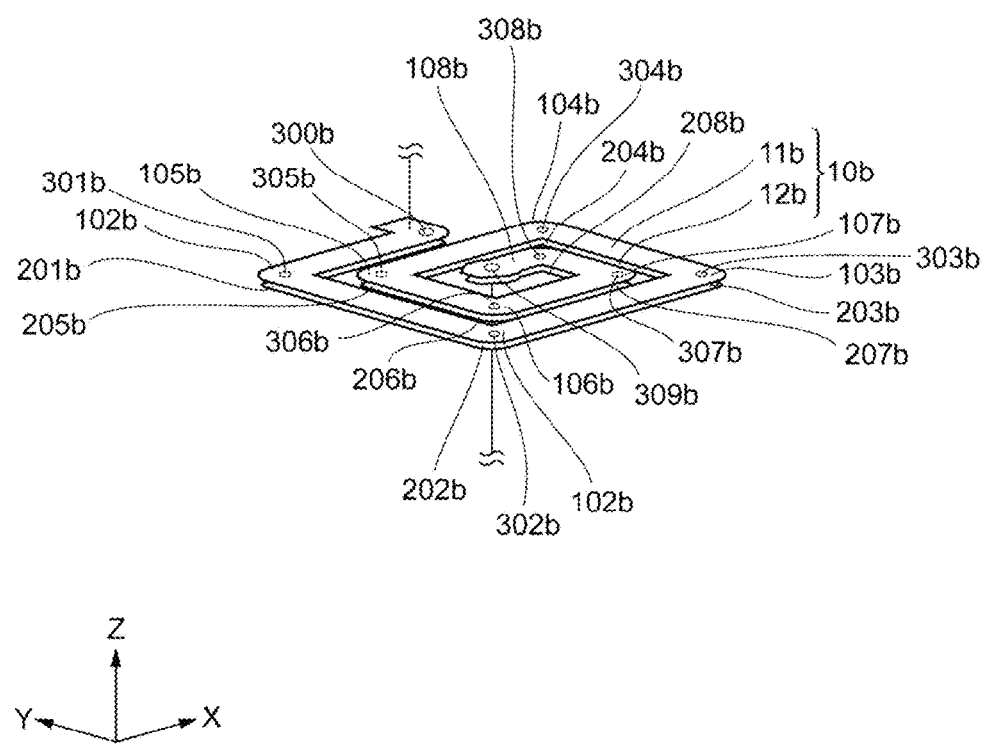
FIG. 7 illustrates an example of an inductor according to another embodiment.

An example of an inductor according to another embodiment will be described below with reference to FIG. 7. FIG. 7 illustrates an example of an inductor 10b according to another embodiment. Elements that have already been explained in the above-described embodiment will not be discussed.

The inductor 10b includes a first wiring 11b formed on a multilayer substrate and a second wiring 12b formed in the multilayer substrate. The first wiring 11b is a flat wiring formed in a substantially spiral shape on a first surface of the multilayer substrate. The second wiring 12b is a flat wiring formed in a substantially spiral shape on a second surface of the multilayer substrate. The first wiring 11b includes first bending portions 101b, 102b, 103b, 104b, 105b, 106b, 107b, and 108b. The second wiring 12b includes second bending portions 201b, 202b, 203b, 204b, 205b, 206b, 207b, and 208b.

The inductor 10b includes via-holes 300b, 301b, 302b, 303b, 304b, 305b, 306b, 307b, 308b, and 309b. The via-holes 300b and 309b connect the first and second wirings 11b and 12b in parallel with each other. The via-hole 301b electrically connects the first and second bending portions 101b and 201b. Likewise, the via-hole 302b electrically connects the first and second bending portions 102b and 202b. The via-hole 303b electrically connects the first and second bending portions 103b and 203b. The via-hole 304b electrically connects the first and second bending portions 104b and 204b. The via-hole 305b electrically connects the first and second bending portions 105b and 205b. The via-hole 306b electrically connects the first and second bending portions 106b and 206b. The via-hole 307b electrically connects the first and second bending portions 107b and 207b. The via-hole 308b electrically connects the first and second bending portions 108b and 208b.

With this configuration, electric charge suitably transfers and disperses via the via-holes 301b through 308b. This makes electric fields less concentrate on the first bending portions 101b through 108b and the second bending portions 201b through 208b. The intensity of electric fields and the intensity of magnetic fields are proportional to each other. The via-holes 301b through 308b thus serve to reduce magnetic fields generated in the first bending portions 101b through 108b and the second bending portions 201b through 208b. As a result, the magnetic fields are less likely to adversely influence surrounding electronic components.

The first and second bending portions 101b and 201b and the via-hole 301b may be disposed such that, when they are projected on the first surface in a predetermined direction, that is, in the Z direction, the projected images thereof overlap each other. Likewise, the first and second bending portions 102b and 202b and the via-hole 302b may be disposed such that, when they are projected on the first surface in a predetermined direction, that is, in the Z direction, the projected images thereof overlap each other. The first and second bending portions 103b and 203b and the via-hole 303b may be disposed such that, when they are projected on the first surface in a predetermined direction, that is, in the Z direction, the projected images thereof overlap each other. The first and second bending portions 104b and 204b and the via-hole 304b may be disposed such that, when they are projected on the first surface in a predetermined direction, that is, in the Z direction, the projected images thereof overlap each other.

The first and second bending portions 105b and 205b and the via-hole 305b may be disposed such that, when they are projected on the first surface in a predetermined direction, that is, in the Z direction, the projected images thereof overlap on each other. The first and second bending portions 106b and 206b and the via-hole 306b may be disposed such that, when they are projected on the first surface in a predetermined direction, that is, in the Z direction, the projected images thereof overlap each other. The first and second bending portions 107b and 207b and the via-hole 307b may be disposed such that, when they are projected on the first surface in a predetermined direction, that is, in the Z direction, the projected images thereof overlap each other. The first and second bending portions 108b and 208b and the via-hole 308b may be disposed such that, when they are projected on the first surface in a predetermined direction, that is, in the Z direction, the projected images thereof overlap each other.

Figure 8:
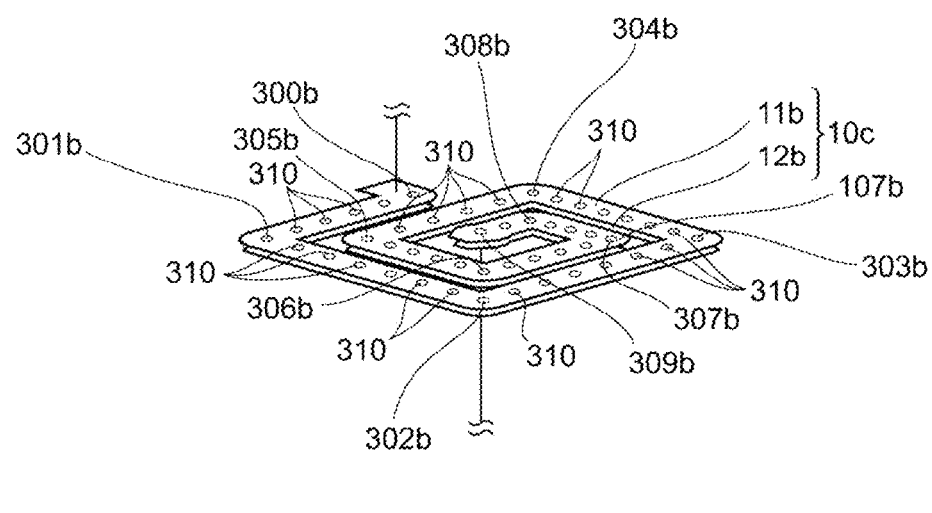
FIG. 8 illustrates an inductor in which via-holes are provided in portions other than bending portions as well as in the bending portions.

In FIG. 7, the via-holes are provided in the bending portions of the inductor 10b. However, the arrangement of via-holes is not restricted to the example shown in FIG. 7. For example, FIG. 8 shows an inductor 10c in which via-holes 310 are provided in portions other than the bending portions as well as in the bending portions. Providing of the via-holes 310 in portions other than the bending portions of the inductor 10c can decrease parasitic resistance components of the inductor 10c without necessarily reducing the inductance value. This makes it possible to reduce the loss of an RF signal caused by the parasitic resistance. The arrangement of via-holes is not restricted to the examples shown in FIGS. 7 and 8. Providing as many via-holes as possible within the manufacturing limitations can enhance the effect of decreasing parasitic resistance components.

The inductors according to the embodiments will be described below with reference to FIGS. 9 through 15.

Figure 9:
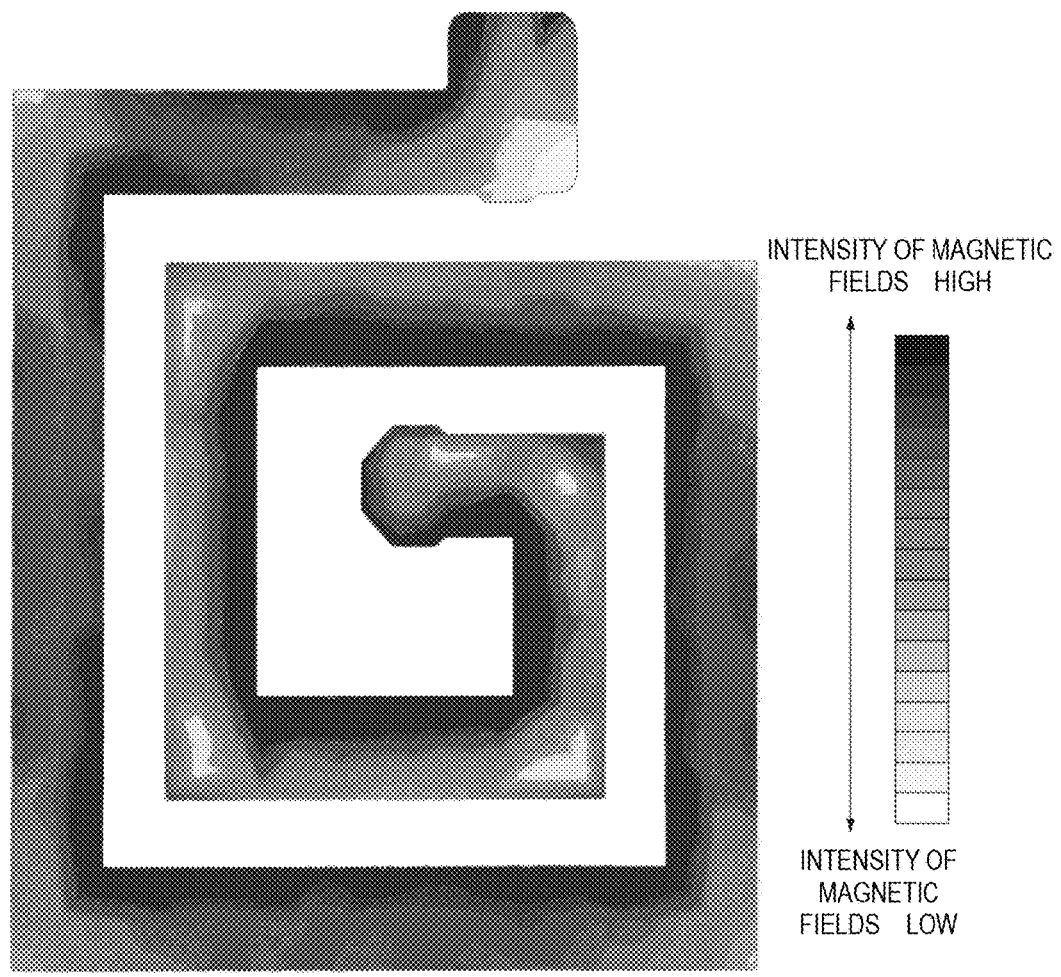
FIG. 9 illustrates an example of the distribution of the magnetic-field intensity of an inductor in which first and second bending portions are not connected to each other with via-holes and the outer and inner peripheries of the first and second bending portions bend substantially perpendicularly.
Figure 10:
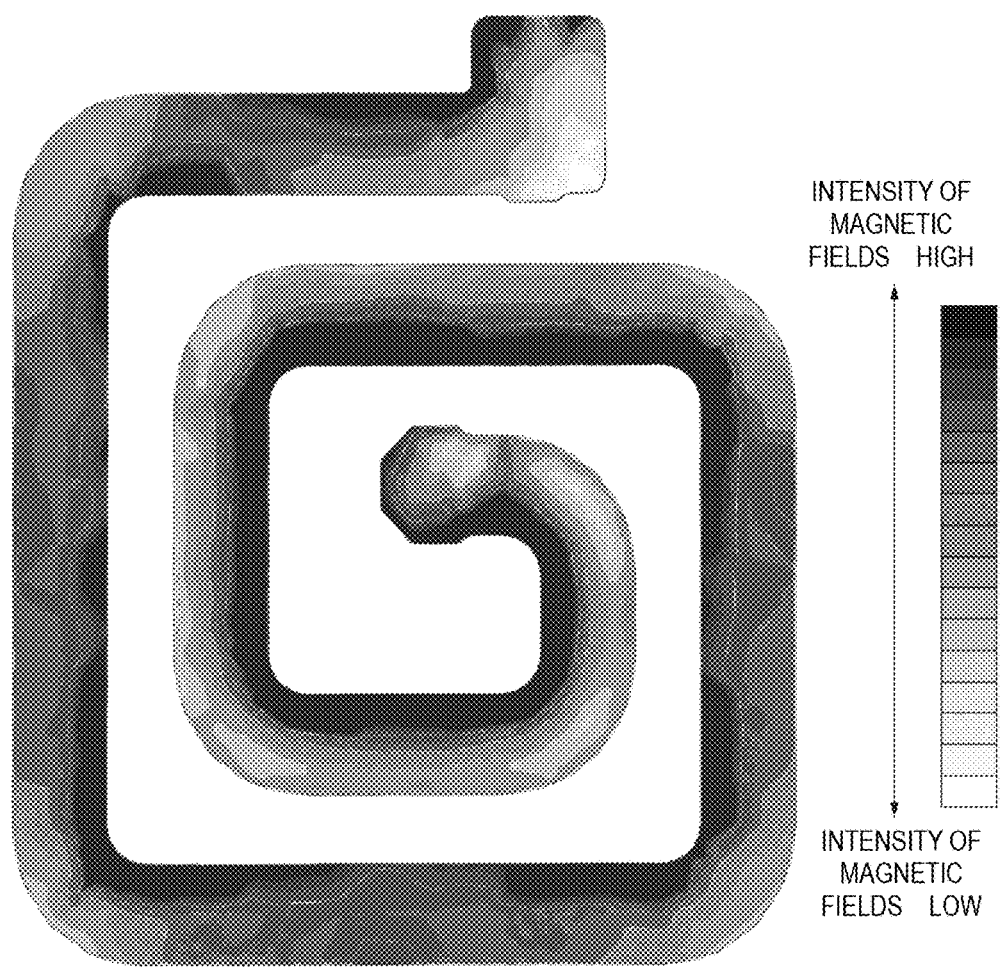
FIG. 10 illustrates an example of the distribution of the magnetic-field intensity of an inductor in which first and second bending portions are not connected to each other with via-holes and the outer and inner peripheries of the first and second bending portions are formed by curves.
Figure 11:
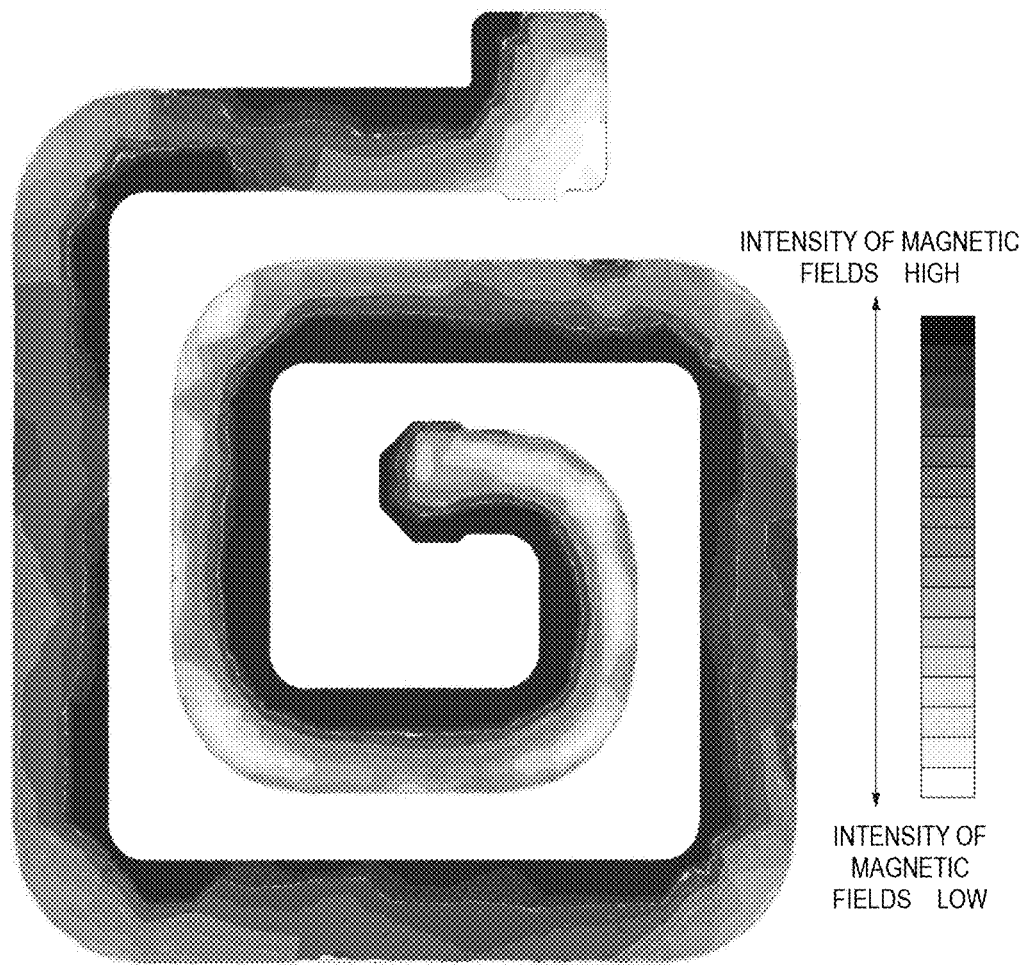
FIG. 11 illustrates an example of the distribution of the magnetic-field intensity of an inductor in which first and second bending portions are connected to each other with via-holes and the outer and inner peripheries of the first and second bending portions are formed by curves.
Figure 12:
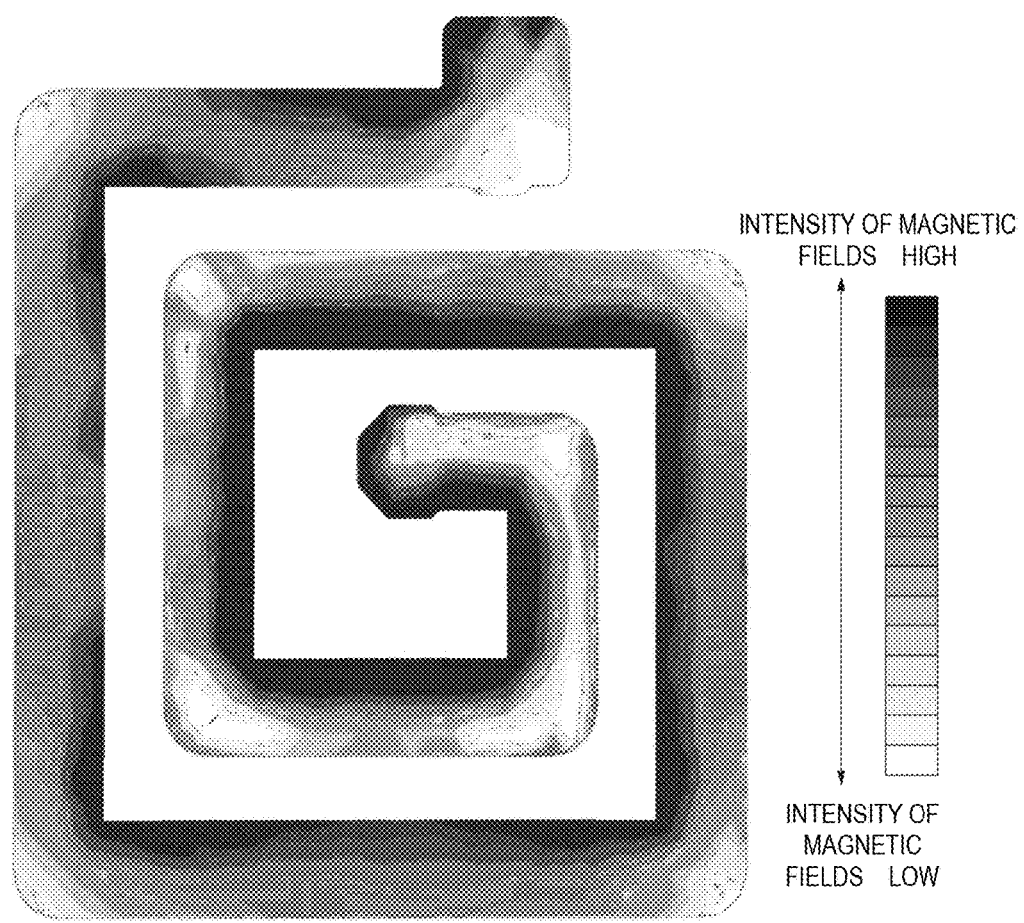
FIG. 12 illustrates an example of the distribution of the magnetic-field intensity of an inductor in which first and second bending portions are not connected to each other with via-holes and the outer peripheries of the first and second bending portions are formed by curves and the inner peripheries thereof bend substantially perpendicularly.
Figure 13:
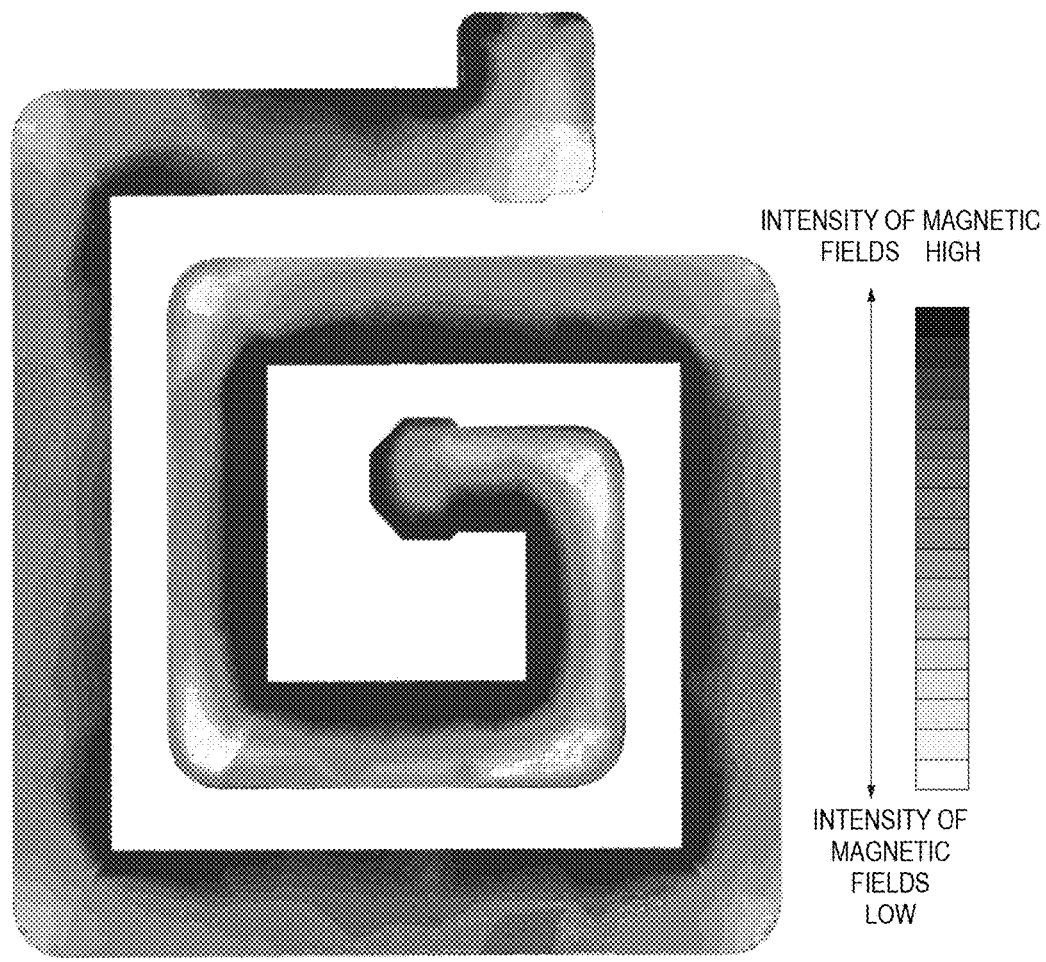
FIG. 13 illustrates an example of the distribution of the magnetic-field intensity of an inductor in which first and second bending portions are connected to each other with via-holes and the outer peripheries of the first and second bending portions are formed by curves and the inner peripheries thereof bend substantially perpendicularly.
Figure 14:
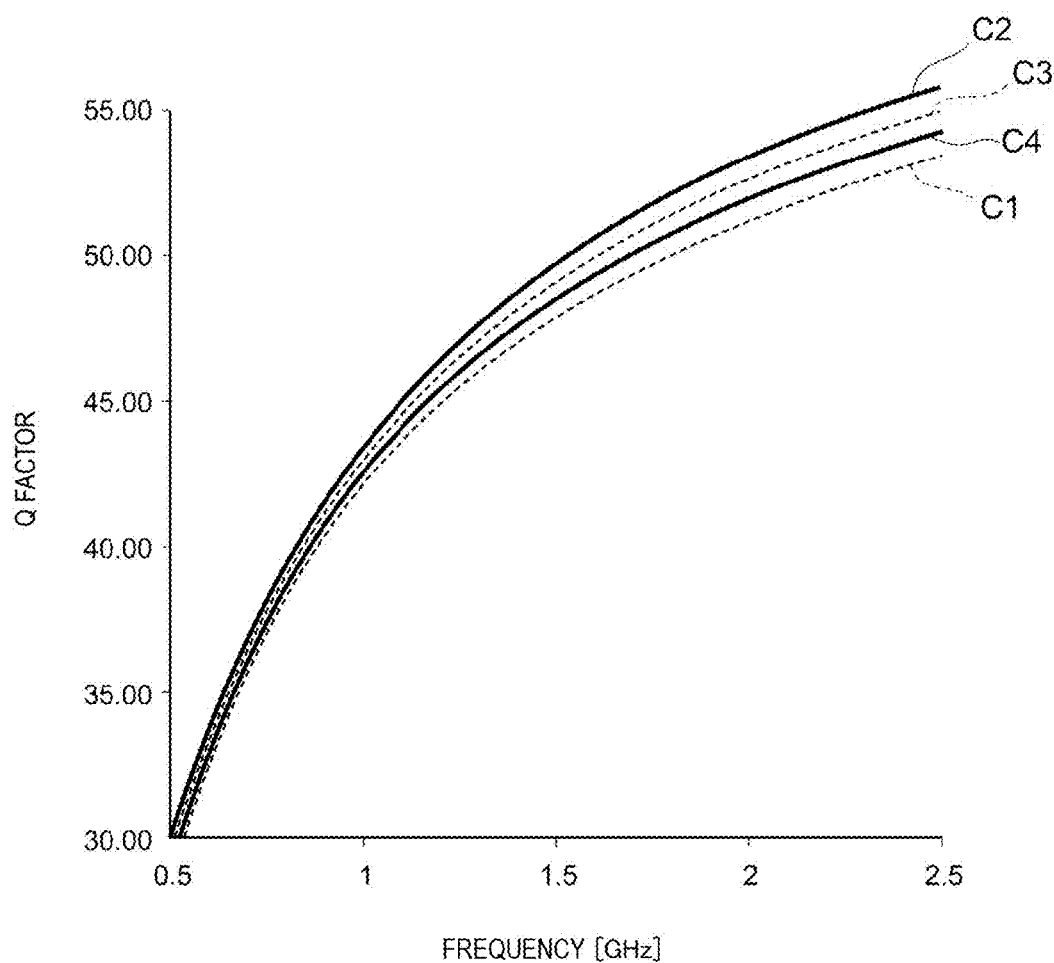
FIG. 14 illustrates simulation results of the quality (Q) factor of the inductors shown in FIGS. 9, 10, 11, and 13.
Figure 15:
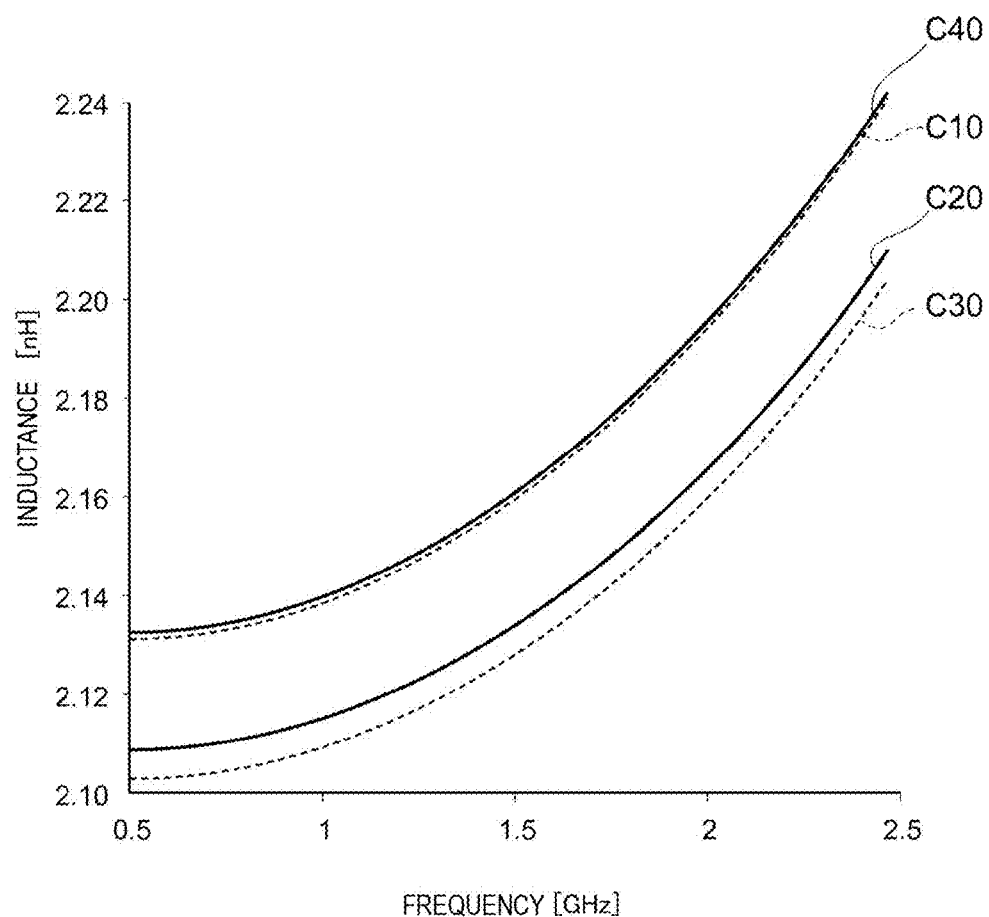
FIG. 15 illustrates simulation results of the inductance of the inductors shown in FIGS. 9, 10, 11, and 13.

FIG. 9 illustrates an example of the distribution of the magnetic-field intensity of an inductor in which first and second bending portions are not connected to each other with via-holes and the outer and inner peripheries of the first and second bending portions bend substantially perpendicularly. FIG. 10 illustrates an example of the distribution of the magnetic-field intensity of an inductor in which first and second bending portions are not connected to each other with via-holes and the outer and inner peripheries of the first and second bending portions are formed by curves. FIG. 11 illustrates an example of the distribution of the magnetic-field intensity of an inductor in which first and second bending portions are connected to each other with via-holes and the outer and inner peripheries of the first and second bending portions are formed by curves. FIG. 12 illustrates an example of the distribution of the magnetic-field intensity of an inductor in which first and second bending portions are not connected to each other with via-holes and the outer peripheries of the first and second bending portions are formed by curves and the inner peripheries thereof bend substantially perpendicularly. FIG. 13 illustrates an example of the distribution of the magnetic-field intensity of an inductor in which first and second bending portions are connected to each other with via-holes and the outer peripheries of the first and second bending portions are formed by curves and the inner peripheries thereof bend substantially perpendicularly. FIG. 14 illustrates simulation results of the quality (Q) factor of the inductors shown in FIGS. 9, 10, 11, and 13. FIG. 15 illustrates simulation results of the inductance of the inductors shown in FIGS. 9, 10, 11, and 13.

The resistance of the inductor shown in FIG. 9 is relatively low because the first and second wirings of the inductor are electrically connected in parallel with each other. As indicated by the curve C1 in FIG. 14, the Q factor of the inductor shown in FIG. 9 is relatively large. The inductor can thus efficiently transfer power from a power supply source to a power amplifier. Additionally, decreasing of the DC resistance can reduce voltage drop of the voltage supplied to the power amplifier, thereby enhancing the efficiency of the power amplifier. Although the inductance formed by the first wiring and that formed by the second wiring are connected in parallel with each other, a certain inductance value can be obtained, thereby preventing a leakage of an RF signal into the power supply source.

As indicated by the curve C10 in FIG. 15, the inductance of the inductor shown in FIG. 9 is relatively high. This is because the outer and inner peripheries of the first and second bending portions bend substantially perpendicularly.

The intensity of magnetic fields of the inductor shown in FIG. 9 is relatively low, as shown in FIG. 9. A relatively low intensity of magnetic fields can reduce an adverse influence on surrounding electronic components.

The resistance of the inductor shown in FIG. 10 is relatively low because the first and second wirings of the inductor are electrically connected in parallel with each other. As indicated by the curve C2 in FIG. 14, the Q factor of the inductor shown in FIG. 10 is relatively large. The inductor can thus efficiently transfer power from a power supply source to a power amplifier.

As indicated by the curve C20 in FIG. 15, the inductance of the inductor shown in FIG. 10 is relatively high. This is because the outer and inner peripheries of the first and second bending portions are formed by curves.

FIG. 10 shows that the intensity of magnetic fields of the inductor in FIG. 10 is lower than that in FIG. 9 as a whole. This phenomenon is particularly noticeable in the vicinity of the outer peripheries of the bending portions. Exhibiting a lower intensity of magnetic fields than that in FIG. 9 can reduce an adverse influence on surrounding electronic components to even a smaller level.

The resistance of the inductor shown in FIG. 10 is relatively low because the first and second wirings of the inductor are electrically connected in parallel with each other. As indicated by the curve C3 in FIG. 14, the Q factor of the inductor shown in FIG. 10 is relatively large. The inductor can thus efficiently transfer power from a power supply source to a power amplifier.

As indicated by the curve C30 in FIG. 15, the inductance of the inductor shown in FIG. 11 is relatively low. This is because the outer peripheries of the first and second bending portions are formed by curves.

FIG. 11 shows that the intensity of magnetic fields of the inductor in FIG. 11 is lower than that in FIG. 10 as a whole. This phenomenon is particularly noticeable in the vicinity of the outer peripheries of the bending portions. The reason for this is that the first and second bending portions of the inductor in FIG. 11 are electrically connected to each other with via-holes. Exhibiting a lower intensity of magnetic fields than that of FIG. 10 can reduce an adverse influence on surrounding electronic components to even a smaller level. When the first and second bending portions connected to each other and the associated via-holes are projected on the end surface of the multilayer substrate, the projected images thereof overlap each other.

FIG. 12 shows that the intensity of magnetic fields of the inductor in FIG. 12 is lower than that in FIG. 11 as a whole. This phenomenon is particularly noticeable in the vicinity of the outer peripheries of the bending portions. Exhibiting a lower intensity of magnetic fields than that in FIG. 11 can reduce an adverse influence on surrounding electronic components to even a smaller level.

The resistance of the inductor shown in FIG. 13 is relatively low because the first and second wirings of the inductor are electrically connected in parallel with each other. As indicated by the curve C4 in FIG. 14, the Q factor of the inductor shown in FIG. 13 is relatively large. The inductor can thus efficiently transfer power from a power supply source to a power amplifier.

As indicated by the curve C40 in FIG. 15, the inductance of the inductor shown in FIG. 13 is relatively high. This is because the outer peripheries of the first and second bending portions are formed by curves and the inner peripheries thereof bend substantially perpendicularly.

FIG. 13 shows that the intensity of magnetic fields of the inductor in FIG. 13 is relatively low. This phenomenon is particularly noticeable in the vicinity of the outer peripheries of the bending portions. The reason for this is that the first and second bending portions of the inductor in FIG. 13 are electrically connected to each other with via-holes. Exhibiting a low intensity of magnetic fields can further reduce an adverse influence on surrounding electronic components. When the first and second bending portions connected to each other and the associated via-holes are projected on the end surface of the multilayer substrate, the projected images thereof overlap each other.

Figure 16:
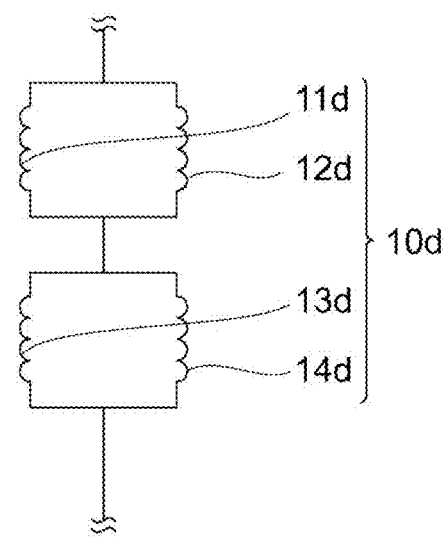
FIG. 16 illustrates another example of an inductor according to the embodiments.

The inductors according to the embodiments are not restricted to those shown in FIGS. 1 and 7. FIG. 16 illustrates another example of an inductor 10d according to the embodiments. As shown in FIG. 16, the inductor 10d may include first and second wirings 11d and 12d electrically connected in parallel with each other and third and fourth wirings 13d and 14d electrically connected in parallel with each other. A parallel inductor unit of the first and second wirings 11d and 12d and a parallel inductor unit of the third and fourth wirings 13d and 14d may be connected in series with each other.

The above-described embodiments are provided for facilitating the understanding of the disclosure, but are not intended to be exhaustive or to limit the disclosure to the precise forms disclosed. Modifications and/or improvements may be made without necessarily departing from the scope and spirit of the disclosure, and equivalents of the disclosure are also encompassed in the disclosure. That is, suitable design changes made to the embodiments by those skilled in the art are also encompassed in the disclosure within the scope and spirit of the disclosure. For example, the elements of the embodiments and the positions, materials, conditions, configurations, and sizes thereof are not restricted to those described in the embodiments and may be changed in an appropriate manner. In the above-described embodiments, some of the elements of one embodiment may be combined with or replaced by some of the elements of another embodiment, and configurations obtained by combination or replacement of elements are also encompassed in the disclosure within the scope and spirit of the disclosure.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. An inductor comprising:
   a first wiring that is formed in a substantially spiral shape on a surface of a first dielectric layer of a multilayer substrate; and
   a second wiring that is formed in a substantially spiral shape on a surface of a second dielectric layer of the multilayer substrate, wherein:
   the multilayer substrate comprises the first dielectric and the second dielectric layer, the first dielectric layer and the second dielectric layer being stacked on each other in a predetermined direction, the surface of the first dielectric layer being an end surface in the predetermined direction, and the surface of the second dielectric layer being within the multilayer substrate,
   a width of the second wiring is less than a width of the first wiring,
   the first wiring and the second wiring are electrically connected in parallel with each other, and
   when the first wiring and the second wiring are projected in the predetermined direction, a projected image of the first wiring completely overlaps a projected image of the second wiring.

2. The inductor according to claim 1, wherein an inductance of the first wiring and an inductance of the second wiring are equal to each other.

3. The inductor according to claim 1, wherein:
   the first wiring comprises a first bending portion, an outer periphery of the first bending portion being formed by a curve; and
   the second wiring comprises a second bending portion, an outer periphery of the second bending portion being formed by a curve.

4. The inductor according to claim 2, wherein:
   the first wiring comprises a first bending portion, an outer periphery of the first bending portion being formed by a curve; and
   the second wiring comprises a second bending portion, an outer periphery of the second bending portion being formed by a curve.

5. The inductor according to claim 3, wherein:
   an inner periphery of the first bending portion bends at substantially ninety degrees; and
   an inner periphery of the second bending portion bends at substantially ninety degrees.

6. The inductor according to claim 3, further comprising:
a via-hole that electrically connects the first wiring and the second wiring,
wherein the first bending portion, the second bending portion, and the via-hole are disposed such that, when the first bending portion, the second bending portion, and the via-hole are projected in the predetermined direction, projected images of the first bending portion, the second bending portion, and the via-hole overlap each other.

7. The inductor according to claim 5, further comprising:
a via-hole that electrically connects the first wiring and the second wiring,
wherein the first bending portion, the second bending portion, and the via-hole are disposed such that, when the first bending portion, the second bending portion, and the via-hole are projected in the predetermined direction, projected images of the first bending portion, the second bending portion, and the via-hole overlap each other.

8. The inductor according to claim 1, further comprising:
a third dielectric layer of the multilayer substrate, the third dielectric layer being stacked in the predetermined direction on the surface of the first dielectric layer and on the first wiring,
wherein the third dielectric layer has a smaller relative dielectric constant than the first dielectric layer and the second dielectric layer.

9. A power amplifier module comprising:
a power amplifier configured to amplify an input signal and output an amplified input signal; and
the inductor according to claim 1, wherein a first end of the inductor is connected to a power supply source and a second end of the inductor is connected to an output terminal of the power amplifier.

10. The power amplifier module according to claim 9, wherein an inductance of the first wiring and an inductance of the second wiring are equal to each other.

11. The inductor according to claim 2, further comprising:
a third dielectric layer of the multilayer substrate, the third dielectric layer being stacked in the predetermined direction on the surface of the first dielectric layer and on the first wiring,
wherein the third dielectric layer has a smaller relative dielectric constant than the first dielectric layer and the second dielectric layer.

12. The inductor according to claim 3, further comprising:
a third dielectric layer of the multilayer substrate, the third dielectric layer being stacked in the predetermined direction on the surface of the first dielectric layer and on the first wiring,
wherein the third dielectric layer has a smaller relative dielectric constant than the first dielectric layer and the second dielectric layer.

13. The inductor according to claim 4, further comprising:
a third dielectric layer of the multilayer substrate, the third dielectric layer being stacked in the predetermined direction on the surface of the first dielectric layer and on the first wiring,
wherein the third dielectric layer has a smaller relative dielectric constant than the first dielectric layer and the second dielectric layer.

14. The inductor according to claim 5, further comprising:
a third dielectric layer of the multilayer substrate, the third dielectric layer being stacked in the predetermined direction on the surface of the first dielectric layer and on the first wiring,
wherein the third dielectric layer has a smaller relative dielectric constant than the first dielectric layer and the second dielectric layer.

15. The inductor according to claim 6, further comprising:
a third dielectric layer of the multilayer substrate, the third dielectric layer being stacked in the predetermined direction on the surface of the first dielectric layer and on the first wiring,
wherein the third dielectric layer has a smaller relative dielectric constant than the first dielectric layer and the second dielectric layer.

16. The inductor according to claim 7, further comprising:
a third dielectric layer of the multilayer substrate, the third dielectric layer being stacked in the predetermined direction on the surface of the first dielectric layer and on the first wiring,
wherein the third dielectric layer has a smaller relative dielectric constant than the first dielectric layer and the second dielectric layer.

* * * * *